US008929569B2

(12) United States Patent
Wu et al.

(10) Patent No.: US 8,929,569 B2
(45) Date of Patent: Jan. 6, 2015

(54) SPEAKER ARRAY CONTROL METHOD AND SPEAKER ARRAY CONTROL SYSTEM

(75) Inventors: Hsiang-Chieh Wu, New Taipei (TW); I-Chun Wu, New Taipei (TW); Guan-Luan Shan, New Taipei (TW)

(73) Assignee: Wistron Corporation, Hsichih, New Taipei (TW)

( * ) Notice: Subject to any disclaimer, the term of this patent is extended or adjusted under 35 U.S.C. 154(b) by 325 days.

(21) Appl. No.: 13/570,254

(22) Filed: Aug. 9, 2012

(65) Prior Publication Data

US 2013/0279720 A1 Oct. 24, 2013

(30) Foreign Application Priority Data

Apr. 18, 2012 (TW) ............................ 101113742 A

(51) Int. Cl.
*H03G 3/00* (2006.01)
*H04R 29/00* (2006.01)

(52) U.S. Cl.
USPC ................................ 381/107; 381/92; 381/59

(58) Field of Classification Search
USPC ...................... 381/107, 92, 300, 306, 59, 387
See application file for complete search history.

(56) References Cited

U.S. PATENT DOCUMENTS

2007/0076905 A1 4/2007 Konagai
2009/0034763 A1 2/2009 Takumai
2010/0014690 A1 1/2010 Wolff
2010/0135503 A1 * 6/2010 Shin et al. ..................... 381/59

OTHER PUBLICATIONS

Office action mailed on Sep. 15, 2014 for the Taiwan application No. 101113742, filing date: Apr. 18, 2012, p. 1 line 13~14, p. 2 and p. 3 line 1~2.

* cited by examiner

*Primary Examiner* — Paul S Kim
(74) *Attorney, Agent, or Firm* — Winston Hsu; Scott Margo

(57) ABSTRACT

A speaker array control method includes steps of detecting a position of an audience located in front of a speaker array, wherein the speaker array includes N speakers and N is a positive integer larger than one; defining a target and a non-target with respect to an i-th speaker of the N speakers according to the position of the audience, wherein i is a positive integer smaller than or equal to N; calculating a weighting vector for the i-th speaker according to the target and the non-target; adjusting a directionality of an output signal of the i-th speaker by the weighting vector and reducing energy of a plurality of side lobes of the output signal of the i-th speaker; and controlling the i-th speaker to output the adjusted output signal when the energy of each of the side lobes is smaller than a threshold.

8 Claims, 7 Drawing Sheets

SPEAKER ARRAY CONTROL METHOD AND SPEAKER ARRAY CONTROL SYSTEM

BACKGROUND OF THE INVENTION

1. Field of the Invention

The invention relates to a speaker array control method and a speaker array control system and, more particularly, to a speaker array control method and a speaker array control system capable of adjusting a directionality of output signals of speakers according to a position of an audience and reducing other noise signals.

2. Description of the Prior Art

As a bezel of a TV is getting narrower and narrower, it is reasonably expected that a TV wall consisting of a plurality of small size TVs with narrow bezel will be developed in the future for satisfying visual requirements. Referring to FIG. 1, FIG. 1 is a schematic diagram illustrating a TV wall 10 consisting of a plurality of small size TVs 100 of the prior art. As shown in FIG. 1, each of the conventional TVs 100 has one pair of built-in speakers 120 with right and left audio channels for outputting audio signals. Accordingly, when the TV wall 10 consists of a plurality of small size TVs 100, all of the speakers 120 of the TVs 100 form a speaker array 12. However, as shown in FIG. 1, since a main beam 122 of output signals of the speaker array 12 is always toward the front of the TV wall 10, the audio signals outputted by the speaker array 12 cannot be transmitted to an audience 20 once the audience 20 is located at right side or left side of the TV wall 10.

SUMMARY OF THE INVENTION

The invention provides a speaker array control method and a speaker array control system capable of adjusting a directionality of output signals of speakers according to a position of an audience and reducing other noise signals, so as to solve the aforesaid problems.

According to the claimed invention, a speaker array control method comprises steps of detecting a position of an audience located in front of a speaker array, wherein the speaker array comprises N speakers and N is a positive integer larger than one; defining a target and a non-target with respect to an i-th speaker of the N speakers according to the position of the audience, wherein i is a positive integer smaller than or equal to N; calculating a weighting vector for the i-th speaker according to the target and the non-target; adjusting a directionality of an output signal of the i-th speaker by the weighting vector and reducing energy of a plurality of side lobes of the output signal of the i-th speaker; and controlling the i-th speaker to output the adjusted output signal when the energy of each of the side lobes is smaller than a threshold.

According to the claimed invention, the step of calculating a weighting vector for the i-th speaker according to the target and the non-target further comprises steps of calculating a delay time for the i-th speaker according to the target and the non-target; calculating a direction vector for the i-th speaker according to the delay time; and calculating the weighting vector according to an energy ratio of the target to the non-target and the direction vector.

According to the claimed invention, the step of reducing energy of a plurality of side lobes of the output signal of the i-th speaker further comprises steps of outputting interference signals toward the non-target; determining whether the energy of each of the side lobes is smaller than the threshold; and if the energy of a first part of the side lobes is smaller than the threshold and the energy of a second part of the side lobes is larger than the threshold, decreasing energy of the interference signals for the first part of the side lobes and increasing energy of the interference signals for the second part of the side lobes.

According to the claimed invention, the speaker array control method further comprises step of recalculating the direction vector using an iterative method according to the increased energy of the interference signals at the non-target so as to optimize the weighting vector.

According to the claimed invention, a speaker array control system comprises a speaker array comprising N speakers, N is a positive integer larger than one; a detector for detecting a position of an audience located in front of the speaker array; and a processor electrically connected to the speaker array and the detector, the processor defines a target and a non-target with respect to an i-th speaker of the N speakers according to the position of the audience, calculates a weighting vector for the i-th speaker according to the target and the non-target, adjusts a directionality of an output signal of the i-th speaker by the weighting vector, reduces energy of a plurality of side lobes of the output signal of the i-th speaker, and controls the i-th speaker to output the adjusted output signal when the energy of each of the side lobes is smaller than a threshold, wherein i is a positive integer smaller than or equal to N.

According to the claimed invention, the processor calculates a delay time for the i-th speaker according to the target and the non-target, calculates a direction vector for the i-th speaker according to the delay time, and calculates the weighting vector according to an energy ratio of the target to the non-target and the direction vector.

According to the claimed invention, the processor outputs interference signals toward the non-target and determines whether the energy of each of the side lobes is smaller than the threshold; if the energy of a first part of the side lobes is smaller than the threshold and the energy of a second part of the side lobes is larger than the threshold, the processor decreases energy of the interference signals for the first part of the side lobes and increases energy of the interference signals for the second part of the side lobes.

According to the claimed invention, the processor recalculates the direction vector using an iterative method according to the increased energy of the interference signals at the non-target so as to optimize the weighting vector.

As mentioned in the above, the invention calculates the weighting vector for each of the speakers according to the position of the audience, adjusting the directionality of the output signal of each speaker by the weighting vector correspondingly, and reduces the energy of the side lobes of the output signal of each speaker. For further description, after detecting the position of the audience, the invention utilizes a beamforming technology to calculate the weighting vector needed by each speaker of the speaker array to output sound wave toward specific direction and utilizes an adaptive algorithm to optimize the weighting vector. Accordingly, the invention can adjust a main beam of output signals of the speaker array toward the audience located at any positions in front of the speaker array and reduce other noise signals simultaneously, so as to enhance audio quality for the audience.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
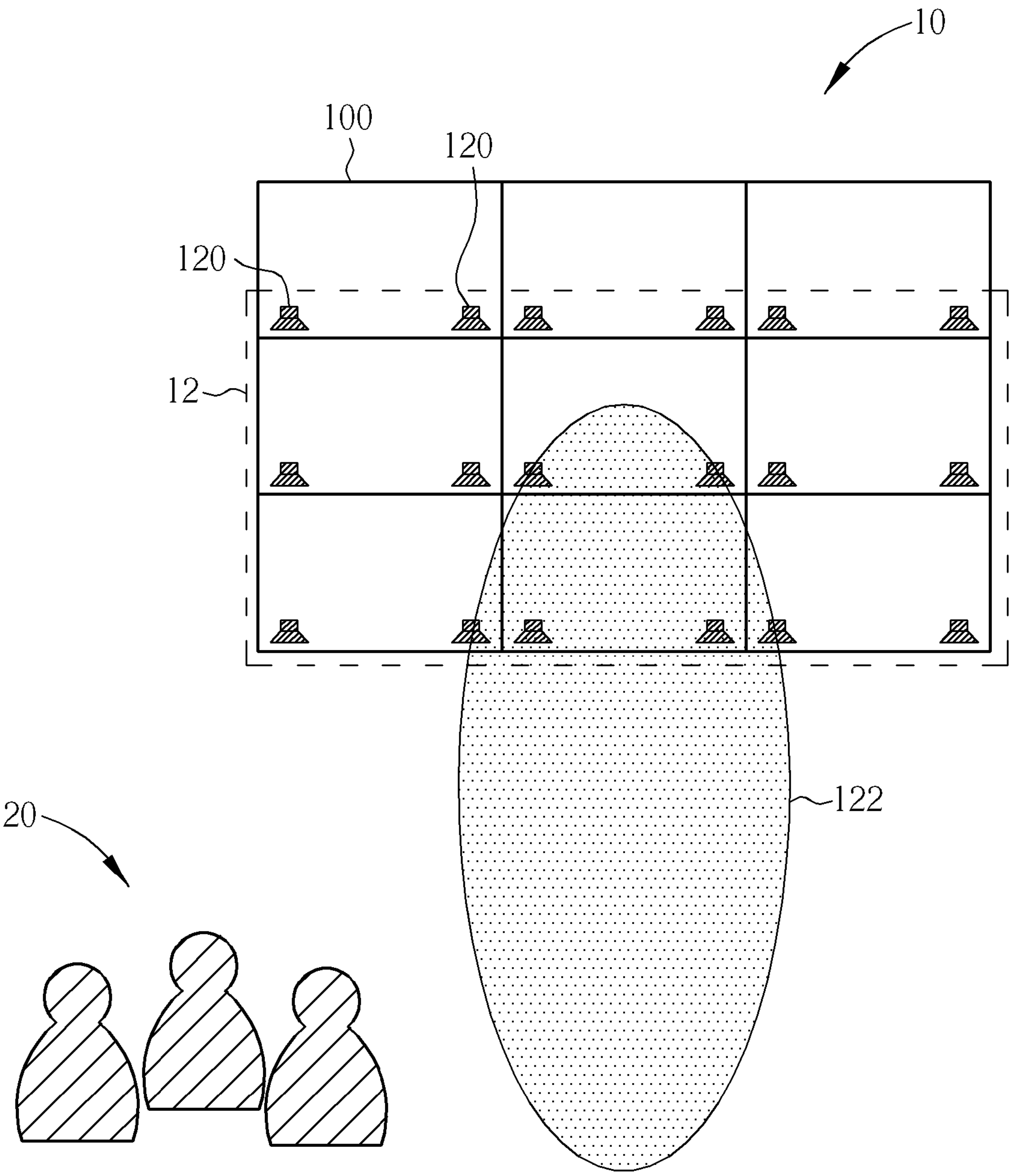
FIG. 1 PRIOR ART
FIG. 1 is a schematic diagram illustrating a TV wall consisting of a plurality of small size TVs of the prior art.
Figure 2:
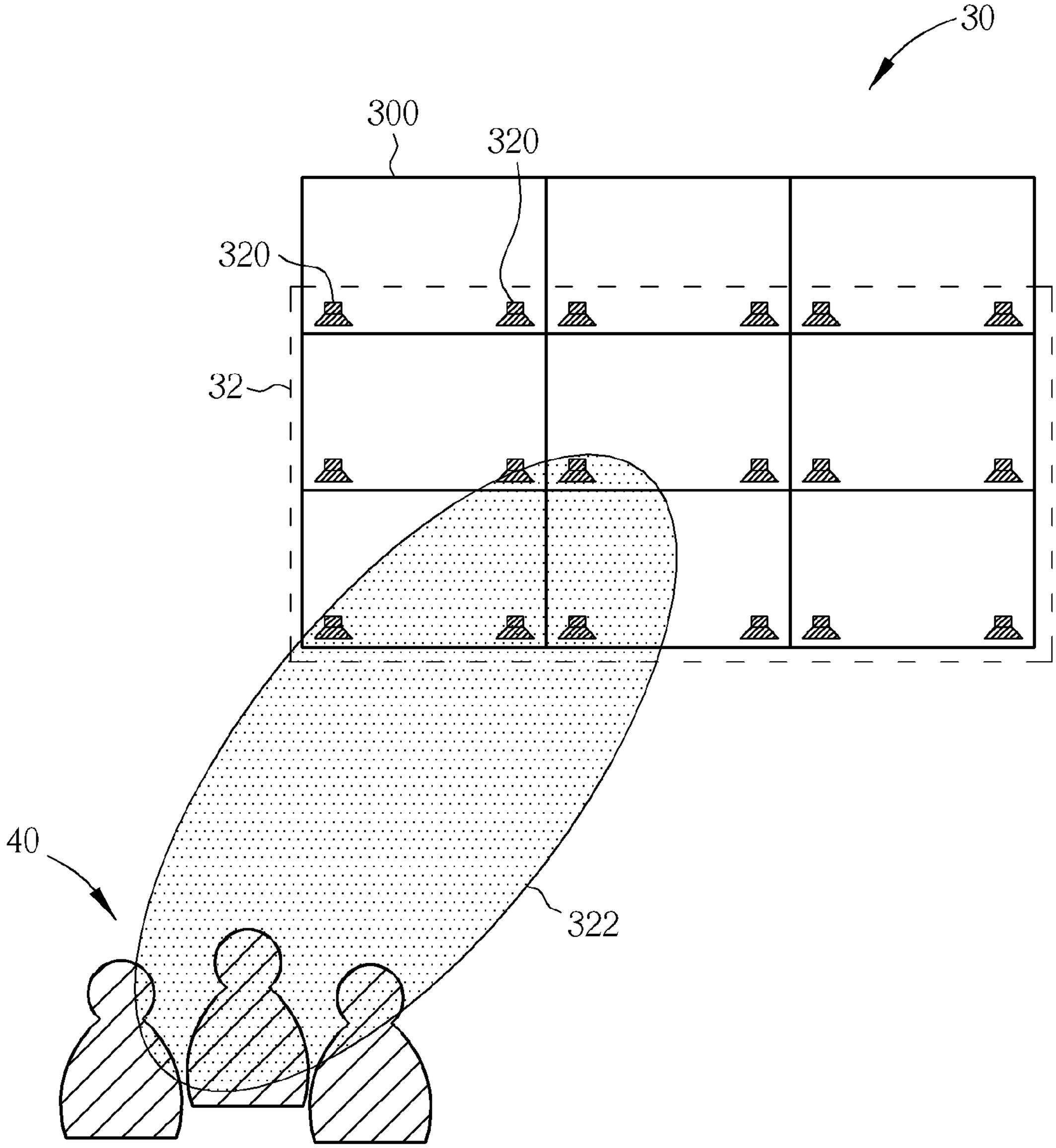
FIG. 2 is a schematic diagram illustrating a TV wall consisting of a plurality of small size TVs according to an embodiment of the invention.
Figure 3:
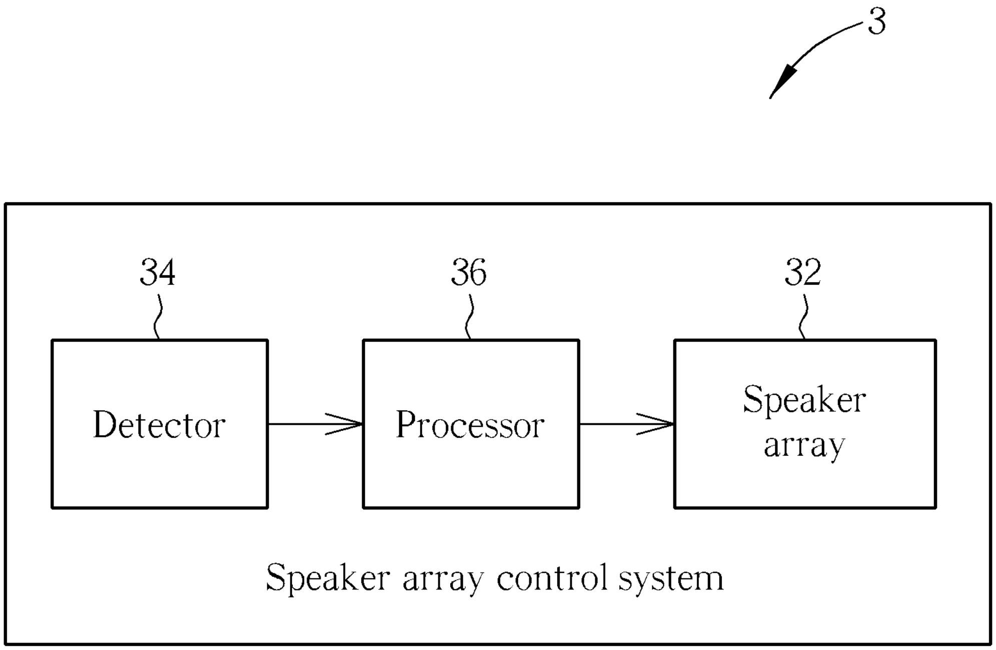
FIG. 3 is a functional block diagram illustrating a speaker array control system according to an embodiment of the invention.
Figure 4:
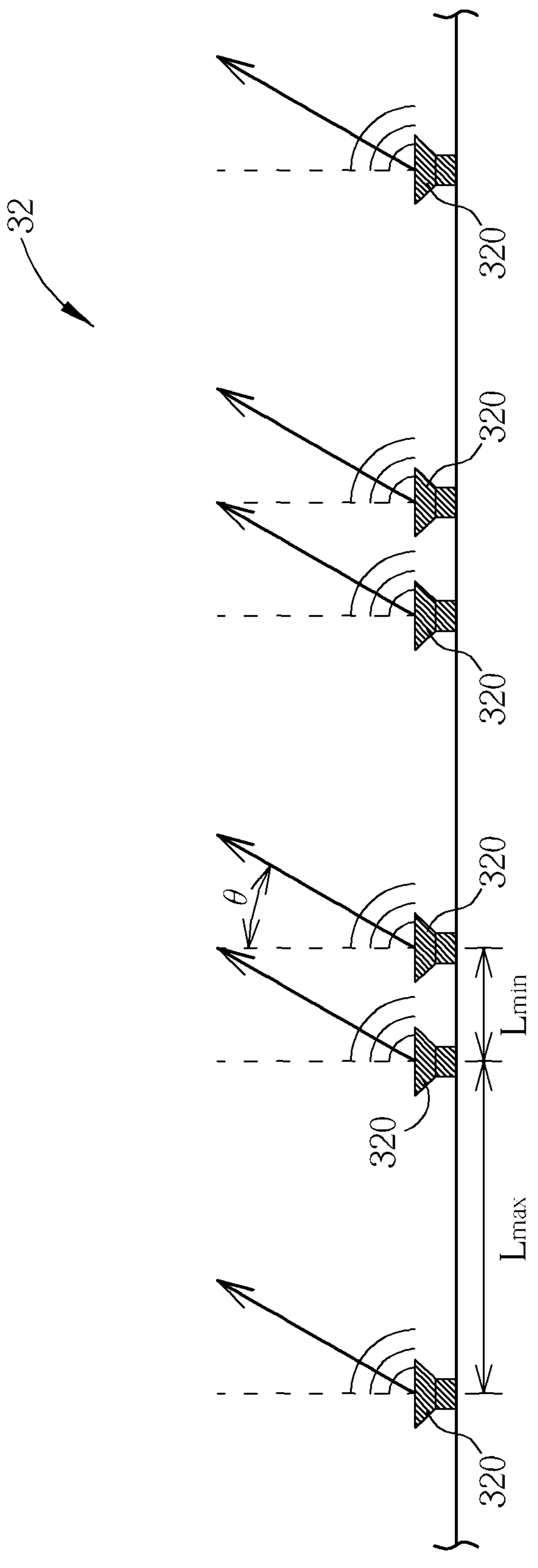
FIG. 4 is a schematic diagram illustrating one row of the speaker array shown in FIG. 2.
Figure 5:
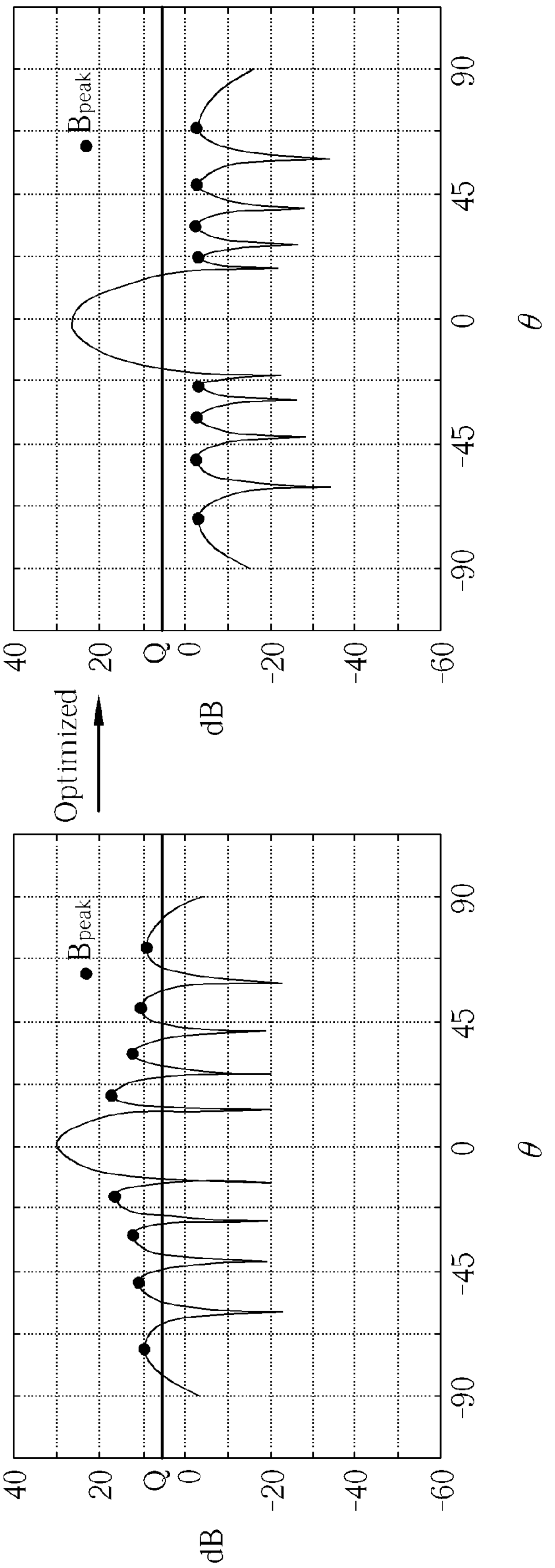
FIG. 5 is a diagram illustrating a lobe pattern of an sound wave after optimization.

Referring to FIGS. 2 to 5, FIG. 2 is a schematic diagram illustrating a TV wall 30 consisting of a plurality of small size TVs 300 according to an embodiment of the invention, FIG. 3 is a functional block diagram illustrating a speaker array control system 3 according to an embodiment of the invention, FIG. 4 is a schematic diagram illustrating one row of the speaker array 32 shown in FIG. 2, and FIG. 5 is a diagram illustrating a lobe pattern of an sound wave after optimization. As shown in FIG. 2, each of the TVs 300 has one pair of built-in speakers 320 with right and left audio channels for outputting audio signals. Accordingly, when a TV wall 30 consists of a plurality of small size TVs 300, all of the speakers 320 of the TVs 300 form a speaker array 32. It should be noted that each of the TVs may be any types of display devices or electronic devices equipped with the speakers 320. Furthermore, the speaker array 32 may consist of a plurality of speakers 320 only without the TVs 300 of the TV wall 30.

As shown in FIG. 3, the speaker array control system 3 of the invention comprises a speaker array 32, a detector 34 and a processor 36, wherein the processor 36 is electrically connected to the speaker array 32 and the detector 34. The speaker array 32 comprises N speaker 320, wherein N is a positive integer larger than one. As shown in FIG. 2, N is equal to, but not limited to, 18. The detector 34 may be an infrared detector or other detectors for detecting a position of an audience 40 located in front of the speaker array 32.

Figure 6:
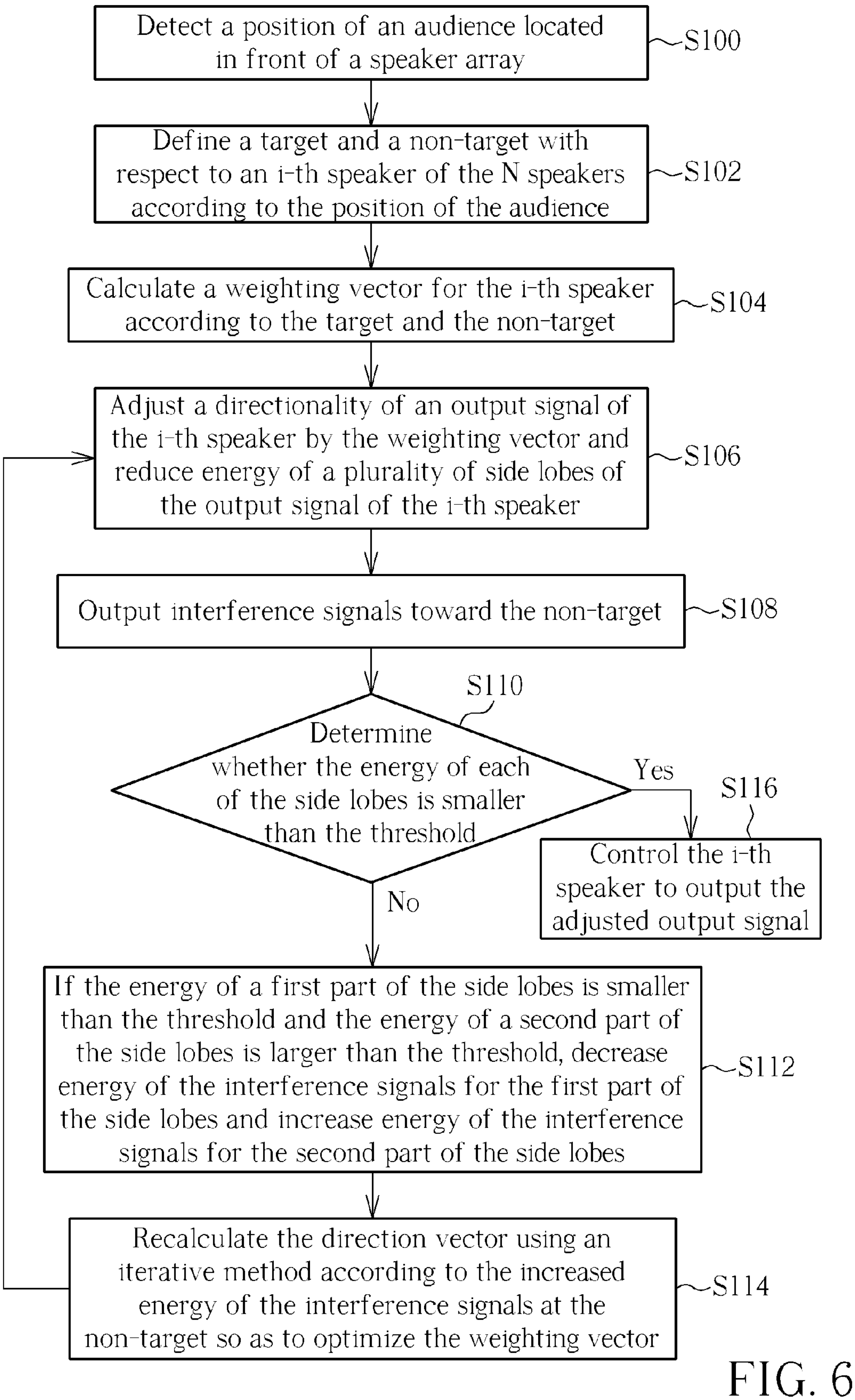
FIG. 6 is a flowchart illustrating a speaker array control method according to an embodiment of the invention.
Figure 7:
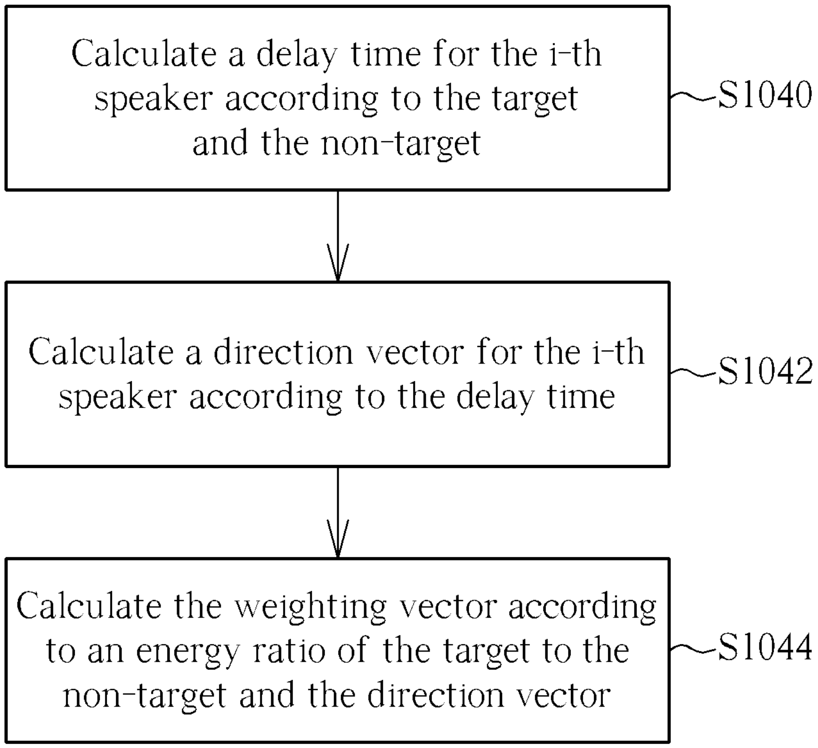
FIG. 7 is a flowchart illustrating the step S104 shown in FIG. 6 in detail.

Referring to FIGS. 6 and 7, FIG. 6 is a flowchart illustrating a speaker array control method according to an embodiment of the invention, and FIG. 7 is a flowchart illustrating the step S104 shown in FIG. 6 in detail. The speaker array control method shown in FIG. 6 can be implemented by the speaker array control system 3 shown in FIGS. 2 and 3. First of all, the detector 34 detects a position of an audience 40 located in front of the speaker array 32 in step S100. Afterward, the processor 36 defines a target and a non-target with respect to an i-th speaker of the N speakers 320 according to the position of the audience 40 in step S102, wherein i is a positive integer smaller than or equal to N. Then, the processor 36 calculates a weighting vector for the i-th speaker 320 according to the target and the non-target in step S104, wherein the weighting vector can be calculated by steps S1040 to S1044 shown in FIG. 7. In step S1040, the processor 36 calculates a delay time for the i-th speaker 320 according to the target and the non-target. Afterward, in step S1042, the processor 36 calculates a direction vector for the i-th speaker 320 according to the delay time. Finally, in step S1044, the processor 36 calculates the weighting vector according to an energy ratio of the target to the non-target and the direction vector.

After calculating the weighting vector, the processor 36 adjusts a directionality of an output signal of the i-th speaker 320 by the weighting vector and reduces energy of a plurality of side lobes of the output signal of the i-th speaker 320 in step S106. Then, the processor 36 outputs interference signals toward the non-target in step S108 and determines whether the energy of each of the side lobes is smaller than a threshold in step S110. If the energy of a first part of the side lobes is smaller than the threshold and the energy of a second part of the side lobes is larger than the threshold, the processor 36 decreases energy of the interference signals for the first part of the side lobes and increases energy of the interference signals for the second part of the side lobes in step S112. Then, the processor 36 recalculates the direction vector using an iterative method according to the increased energy of the interference signals at the non-target so as to optimize the weighting vector in step S114 and the step S106 is performed again. On the other hand, the processor 36 controls the i-th speaker 320 to output the adjusted output signal when the energy of each of the side lobes is smaller than the threshold in step S116.

The feature of the invention will be depicted in the following using FIGS. 4 and 5.

In the beginning, the invention can calculate a directional (θ) sound wave, which is represented by the following equation 1, using phase retardation based on 1D speaker array 32 arranged periodically in FIG. 4.

Equation 1

$$\begin{bmatrix} x_1(t) \\ x_2(t) \\ \vdots \\ x_N(t) \end{bmatrix} = \begin{bmatrix} A_1 v(t-\tau_1) \\ A_2 v(t-\tau_2) \\ \vdots \\ A_N v(t-\tau_N) \end{bmatrix} + \begin{bmatrix} n_1(t) \\ n_2(t) \\ \vdots \\ n_N(t) \end{bmatrix}.$$

The equation 1 can be converted into the following equation 2.

$$x(t)=A_s v(t-\tau)+A_i p(t-\tau)+n(t). \qquad \text{Equation 2:}$$

In the equation 2, $A_s$ represents an amplitude of an audio signal and varies based on the volume, $A_i$ represents an amplitude of the interference signal and is set as 0 initially, n(t) represents a noise signal, t represents time, and τ represents the aforesaid delay time.

The aforesaid delay time τ can be calculated by the following equation 3.

Equation 3

$$\tau_j = \frac{\left[\sum_{s=1}^{j-1}\left(\sqrt[\frac{2}{3}]{\frac{3\cdot(L_{max}+L_{min})}{4\cdot(L_{max}-L_{min})}}\right)_s\right]\cdot \sin\theta}{c}.$$

In the equation 3, $\tau_j$ represents the delay time of the (N−1)th speaker 320, $L_{max}$ represents the maximum periodical interval as shown in FIG. 4, and $L_{min}$ represents the minimum periodical interval as shown in FIG. 4

The equation 3 can be converted into frequency domain through Fourier transform represented by the following equation 4.

$$X(\omega)=V(\omega)b+N(\omega). \qquad \text{Equation 4:}$$

In the equation 4, b represents the aforesaid direction vector and can be represented by the following equation 5.

$$b=[\exp(-j2\pi f\tau_0)` \ldots ' \exp(-j2\pi f\tau_{N-1})]^T. \qquad \text{Equation 5:}$$

After calculating the weighting vector W in specific direction, the output signal Y can be represented by the following equation 6.

$$Y(\omega) = \sum_{n=1}^{N} W_n^*(\omega)X_n(\omega) = W^H X. \qquad \text{Equation 6}$$

Then, the energy ratio of the target to the non-target with respect to the audio signal can be represented by the following equation 7.

$$J = \frac{B_{target}}{B_{non\text{-}target}} = \frac{W^H U_{target} W}{W^H U_{non\text{-}target} W}, \qquad \text{Equation 7}$$

$$\text{wherein } B = |W^H b|^2,\ U_{target} = E\{b_{target} b_{target}^H\} \text{ and } U_{non\text{-}target} = E\{b_{non\text{-}target} b_{non\text{-}target}^H\}.$$

In the equation 7, B represents a function of energy to lobe pattern, $U_{target}$ represents a covariance matrix of the direction vector at the target, and $U_{non\text{-}target}$ represents a covariance matrix of the direction vector at the non-target.

Then, the energy ratio can be maximized to obtain an initial value of the weighting vector W, which is represented by the following equation 8.

$$W = U_{non\text{-}target}^{-1} b_t^* \qquad \text{Equation 8:}$$

Then, a lobe pattern of the directional sound wave can be drawn according to the function B of energy to lobe pattern and a threshold Q is set for the energy of the interference signal at the non-target, as shown in FIG. 5. If the energy of a first part of the side lobes is smaller than the threshold Q and the energy of a second part of the side lobes is larger than the threshold Q, the processor 36 will decrease the energy of the interference signals for the first part of the side lobes and increase the energy of the interference signals for the second part of the side lobes (i.e. the aforesaid step S112). Then, a function $d(\theta)_k$ is set for the energy value $B_{peak}$ at a peak of the side lobe of the lobe pattern shown in FIG. 5, wherein k represents an iteration count. Then, a virtual interference signal is added to the non-target using an iterative method by the following equation 9.

$$A_{i,k+1} = \begin{cases} 0, & \theta \in \text{target} \\ \max[0, \Gamma_k], & \text{otherwise} \end{cases}, \qquad \text{Equation 9}$$

wherein $$\Gamma^k = A_{i,k} + 10^{[B_{peak}(\theta)_k - d(\theta)_k]/10}.$$

Afterward, the increased amplitude Ai of the interference signal is put into the equation 2 so as to obtain a new direction vector ($b_{non\text{-}target}$) at the non-target. Then, the new direction vector ($b_{non\text{-}target}$) at the non-target is put into $U_{non\text{-}target} = E\{b_{non\text{-}target} b_{non\text{-}target}^H\}$ so as to obtain the following equation 10.

$$U_{non\text{-}target} = \sum_{m=1}^{M} A_{i,k} \cdot b_{non\text{-}target,m} b_{non\text{-}target,m}^T, \qquad \text{Equation 10}$$

wherein M represents the number of peaks of the side lobes of the lobe pattern. As shown in FIG. 5, M is equal to, but not limited to, 8. Then, $U_{non\text{-}target}$, which is recalculated by the equation 10, is put into the equation 8 so as to obtain an optimal weighting vector. When the energy of each of the side lobes is smaller than the threshold Q, the processor 36 will controls the speaker 320 to output the adjusted output signal (i.e. the aforesaid step S116).

Accordingly, the processor 36 can calculate the optimal weighting vector of each speaker 320 according to the aforesaid calculation manner, adjust a directionality of the output signal of each speaker 320 by the optimal weighting vector, and reduce the energy of the side lobes of the output signal of each speaker 320 (i.e. the aforesaid step S106). Consequently, the speaker array control system 3 can adjust a main beam 322 of the output signals of the speaker array 32 toward the audience 40 located at any positions in front of the speaker array 32, as shown in FIG. 2.

Furthermore, the control logic of the speaker array control method shown in FIG. 6 and the control logic of the method for calculating the weighting vector shown in FIG. 7 can be implemented by software using the aforesaid equations 1 to 10. It is reasonably expected that each part or function of the control logics may be implemented by software, hardware or the combination thereof. Moreover, the control logics can be embodied by a computer readable storage medium, wherein the computer readable storage medium stores instructions, which can be executed by an electronic device so as to generate control command for controlling the electronic device to execute corresponding function.

As mentioned in the above, the invention calculates the weighting vector for each of the speakers according to the position of the audience, adjusting the directionality of the output signal of each speaker by the weighting vector correspondingly, and reduces the energy of the side lobes of the output signal of each speaker. For further description, after detecting the position of the audience, the invention utilizes a beamforming technology to calculate the weighting vector needed by each speaker of the speaker array to output sound wave toward specific direction and utilizes an adaptive algorithm to optimize the weighting vector. Accordingly, the invention can adjust the main beam of the output signals of the speaker array toward the audience located at any positions in front of the speaker array and reduce other noise signals simultaneously, so as to enhance audio quality for the audience.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A speaker array control method comprising:

detecting a position of an audience located in front of a speaker array, wherein the speaker array comprises N speakers and N is a positive integer larger than one;

defining a target and a non-target with respect to an i-th speaker of the N speakers according to the position of the audience, wherein i is a positive integer smaller than or equal to N;

calculating a weighting vector for the i-th speaker according to the target and the non-target;

adjusting a directionality of an output signal of the i-th speaker by the weighting vector and reducing energy of a plurality of side lobes of the output signal of the i-th speaker; and controlling the i-th speaker to output the adjusted output signal when the energy of each of the side lobes is smaller than a threshold.

2. The speaker array control method of claim 1, wherein calculating a weighting vector for the i-th speaker according to the target and the non-target comprises:

calculating a delay time for the i-th speaker according to the target and the non-target;

calculating a direction vector for the i-th speaker according to the delay time; and calculating the weighting vector according to an energy ratio of the target to the non-target and the direction vector.

3. The speaker array control method of claim 2, wherein reducing energy of a plurality of side lobes of the output signal of the i-th speaker comprises:

outputting interference signals toward the non-target;

determining whether the energy of each of the side lobes is smaller than the threshold; and if the energy of a first part of the side lobes is smaller than the threshold and the energy of a second part of the side lobes is larger than the threshold, decreasing energy of the interference signals for the first part of the side lobes and increasing energy of the interference signals for the second part of the side lobes.

4. The speaker array control method of claim 3, further comprising:

recalculating the direction vector using an iterative method according to the increased energy of the interference signals at the non-target so as to optimize the weighting vector.

5. A speaker array control system comprising:

a speaker array comprising N speakers, N being a positive integer larger than one;

a detector for detecting a position of an audience located in front of the speaker array; and a processor electrically connected to the speaker array and the detector, the processor defining a target and a non-target with respect to an i-th speaker of the N speakers according to the position of the audience, calculating a weighting vector for the i-th speaker according to the target and the non-target, adjusting a directionality of an output signal of the i-th speaker by the weighting vector, reducing energy of a plurality of side lobes of the output signal of the i-th speaker, and controlling the i-th speaker to output the adjusted output signal when the energy of each of the side lobes is smaller than a threshold, wherein i is a positive integer smaller than or equal to N.

6. The speaker array control system of claim 5, wherein the processor calculates a delay time for the i-th speaker according to the target and the non-target, calculates a direction vector for the i-th speaker according to the delay time, and calculates the weighting vector according to an energy ratio of the target to the non-target and the direction vector.

7. The speaker array control system of claim 6, wherein the processor outputs interference signals toward the non-target and determines whether the energy of each of the side lobes is smaller than the threshold; if the energy of a first part of the side lobes is smaller than the threshold and the energy of a second part of the side lobes is larger than the threshold, the processor decreases energy of the interference signals for the first part of the side lobes and increases energy of the interference signals for the second part of the side lobes.

8. The speaker array control system of claim 7, wherein the processor recalculates the direction vector using an iterative method according to the increased energy of the interference signals at the non-target so as to optimize the weighting vector.

* * * * *